(12) United States Patent
Choi et al.

(10) Patent No.: US 8,356,234 B2
(45) Date of Patent: Jan. 15, 2013

(54) APPARATUS AND METHOD FOR TRANSMITTING AND RECEIVING DATA IN A MOBILE COMMUNICATION SYSTEM

(75) Inventors: Jong-Soo Choi, Suwon-si (KR); Yan Xin, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 1023 days.

(21) Appl. No.: 12/139,816

(22) Filed: Jun. 16, 2008

(65) Prior Publication Data

US 2008/0313526 A1 Dec. 18, 2008

(30) Foreign Application Priority Data

Jun. 15, 2007 (KR) .......................... 10-2007-0059165
Aug. 10, 2007 (KR) .......................... 10-2007-0080929
Aug. 31, 2007 (KR) .......................... 10-2007-0088209

(51) Int. Cl.
*H03M 13/00* (2006.01)
(52) U.S. Cl. ........................................ 714/780; 714/762
(58) Field of Classification Search .................. None
See application file for complete search history.

(56) References Cited

U.S. PATENT DOCUMENTS

| 7,028,230 | B2* | 4/2006 | Manninen et al. | 714/702 |
|---|---|---|---|---|
| 7,710,926 | B2* | 5/2010 | Beale | 370/335 |
| 2002/0199147 | A1* | 12/2002 | Kim et al. | 714/748 |
| 2003/0081690 | A1* | 5/2003 | Kim et al. | 375/264 |
| 2003/0120995 | A1* | 6/2003 | Kim et al. | 714/786 |
| 2006/0123310 | A1* | 6/2006 | Wang et al. | 714/746 |
| 2006/0156172 | A1* | 7/2006 | Kim et al. | 714/755 |
| 2008/0148129 | A1* | 6/2008 | Moon et al. | 714/758 |

* cited by examiner

*Primary Examiner* — Scott Baderman
*Assistant Examiner* — Neil Miles
(74) *Attorney, Agent, or Firm* — The Farrell Law Firm, P.C.

(57) ABSTRACT

An apparatus and method for transmitting and receiving symbols in a mobile communication system, in which a multiplexer and burst mapper divides each of first and second group data blocks into a plurality of sub-blocks, the symbols including the first group data block and the second group data block, the second group data block having a different priority level from the first group data block, and maps a combination of one of the first group data sub-blocks and one of the second group data sub-blocks to each burst. A modulator maps a bit of the first group data sub-block and a bit of the second group data sub-block to a symbol according to a bit reliability pattern of modulation symbols in each burst.

10 Claims, 15 Drawing Sheets

APPARATUS AND METHOD FOR TRANSMITTING AND RECEIVING DATA IN A MOBILE COMMUNICATION SYSTEM

PRIORITY

This application claims priority under 35 U.S.C. §119(a) to a Korean Patent Application filed in the Korean Intellectual Property Office on Jun. 15, 2007 and assigned Serial No. 2007-59165, a Korean Patent Application filed in the Korean Intellectual Property Office on Aug. 10, 2007 and assigned Serial No. 2007-80929, and a Korean Patent Application filed in the Korean Intellectual Property Office on Aug. 31, 2007 and assigned Serial No. 2007-88209, the entire disclosures of which are hereby incorporated by reference.

BACKGROUND OF THE INVENTION

1. Field of the Invention

The present invention generally relates to an apparatus and method for transmitting and receiving data in a mobile communication system. More particularly, the present invention relates to a data transmission apparatus and method and a corresponding data reception apparatus and method, for improving system performance in a mobile communication system.

2. Description of the Related Art

Generally, mobile communication systems such as Code Division Multiple Access (CDMA) use error correction coding schemes to reduce the effects of signal distortion and noise during high-speed data transmission and reception.

To use an error correction coding scheme, a transmitter avoids burst errors by subjecting adjacent symbols or bits to irregular channel fading using a plurality of interleavers. The transmitter multiplexes interleaved data blocks, maps the multiplexed data blocks to bursts, and performs symbol mapping according to a high-order modulation scheme such as 8-ary Phase Shift Keying (8PSK), 16-ary Quadrature Amplitude Modulation (16QAM), 32QAM, or 64QAM.

Symbol Mapping based on Priority (SMP) was proposed for implementation in the transmitter to improve system performance by symbol mapping based on the priorities of systematic bits (S bits) and Parity bits (P bits) resulting from channel coding according to a coding scheme. In SMP, conventionally, a first interleaver interleaves the S bits and a second interleaver interleaves the P bits. Thereafter, symbols are mapped according to a coding rate and the reliability pattern of a high-order modulation scheme. When the SMP is applied to transmission data blocks, the number of high-reliability bits is determined by the reliability pattern of a used modulation scheme. For example, a reliability pattern can be [H H L L] for 16QAM and [H H M M L L] for 64QAM.

To facilitate application of SMP based on the reliability pattern of a modulation scheme, the S bits and the P bits can be divided into two sub-blocks. In the sub-block division scheme, a distributor efficiently divides a coded bit block (or a coded bit stream block) received from a channel encoder into two sub-blocks and provides them to interleavers, instead of simply transmitting the coded bit block separately as the S bits and the P bits to the interleavers in a system supporting a plurality of coding rates and data rates. The two sub-blocks are independently interleaved, multiplexed, and burst-mapped.

In the transmitter, the distributor divides a channel coded data bit stream including S bits and P bits into two sub-blocks. The first and second interleavers interleave the sub-blocks independently. To overcome burst errors during transmission on a fading channel, the data of these interleaved data blocks should be distributed to a plurality of bursts. Also, it is preferred that the performance of the data of each burst is improved by symbol mapping such as SMP that can be applied to a high-order modulation.

Accordingly, there is a need for an apparatus and method for transmitting and receiving data by symbol mapping based on priorities of S bits and P bits and less sensitive to a channel fading environment, such as SMP, in order to improve system performance.

SUMMARY OF THE INVENTION

The present invention has been designed to address at least the problems and/or disadvantages above, and to provide at least the advantages described below. Accordingly, an aspect of the present invention is to provide a data transmission apparatus and method for determining sub-block division based on a bit reliability pattern of a high-order modulation scheme and then multiplexing two sub-blocks interleaved by parallel interleavers to a plurality of bursts to render the sub-blocks less sensitive to channel fading. Further, corresponding a data reception apparatus and method is provided.

Another aspect the present invention is to provide a data transmission apparatus and method for efficiently mapping bits to high-order modulation symbols on a symbol basis and on a block basis according to a bit reliability pattern of high-order modulation symbols in multiplexed bursts, and to provide corresponding a data reception apparatus and method.

In accordance with an aspect of the present invention, an apparatus is provided for transmitting symbols in a mobile communication system, in which a multiplexer and burst mapper divides each of first and second group data blocks into a plurality of sub-blocks, the symbols including the first group data block and the second group data block with a different priority level from the first group data block, and maps a combination of one of the first group data sub-blocks and one of the second group data sub-blocks to each burst. A modulator maps a bit of the first group data sub-block and a bit of the second group data sub-block to a symbol according to a bit reliability pattern of modulation symbols in the each burst.

In accordance with another aspect of the present invention, a method is provided for transmitting symbols in a mobile communication system, in which the symbols include the first group data block and the second group data block with a different priority level from the first group data block, each of the first and second group data blocks is divided into a plurality of sub-blocks, a combination of one of the first group data sub-blocks and one of the second group data sub-blocks is mapped to each burst, and a bit of the first group data sub-block and a bit of the second group data sub-block are mapped to a symbol according to a bit reliability pattern of modulation symbols in the each burst.

In accordance with another aspect of the present invention, an apparatus is provided for receiving symbols in a mobile communication system, in which the symbols were produced by dividing each of a first group data block and a second group data block with a different priority level from the first group data block into a plurality of sub-blocks, mapping a combination of one of the first group data sub-blocks and one of the second group data sub-blocks to each burst, and mapping a bit of the first group data sub-block and a bit of the second group data sub-block to a symbol according to a bit reliability pattern of modulation symbols in the each burst. An equalizer receives the symbols and demodulates the symbols to a plurality of bursts, a demultiplexer and burst demapper divides the plurality of bursts into two data blocks, first and second deinterleavers deinterleave the two data blocks, respectively. A de-distributor separates the deinterleaved data into first group data and second group data, a buffer buffers the first group data and the second group data, and a channel decoder recovers the buffered first group data and second group data to the first and second group data blocks.

In accordance with another aspect of the present invention, a method is provided for receiving symbols in a mobile communication system, in which the symbols were produced by dividing each of a first group data block and a second group data block with a different priority level from the first group data block into a plurality of sub-blocks, mapping a combination of one of the first group data sub-blocks and one of the second group data sub-blocks to each burst, and mapping a bit of the first group data sub-block and a bit of the second group data sub-block to a symbol according to a bit reliability pattern of modulation symbols in the each burst. The symbols are received and demodulated to a plurality of bursts, the plurality of bursts are divided into two data blocks, the two data blocks are deinterleaved, respectively, and separated into first group data and second group data. The first group data and the second group data are buffered, and the first and second group data blocks are recovered from the buffered first group data and second group data.

BRIEF DESCRIPTION OF THE DRAWINGS

The above and other objects, features, and advantages of certain exemplary embodiments of the present invention will be more apparent from the following detailed description taken in conjunction with the accompanying drawings, in which.

Throughout the drawings, the same drawing reference numerals will be understood to refer to the same elements, features, and structures.

DETAILED DESCRIPTION OF EXEMPLARY EMBODIMENTS

The matters defined in the description such as a detailed construction and elements are provided to assist in a comprehensive understanding of some exemplary embodiments of the present invention. Accordingly, those of ordinary skill in the art will recognize that various changes and modifications of the embodiments described herein can be made without departing from the scope and spirit of the invention. Also, descriptions of well-known functions and constructions are omitted herein for clarity and conciseness.

Figure 1:
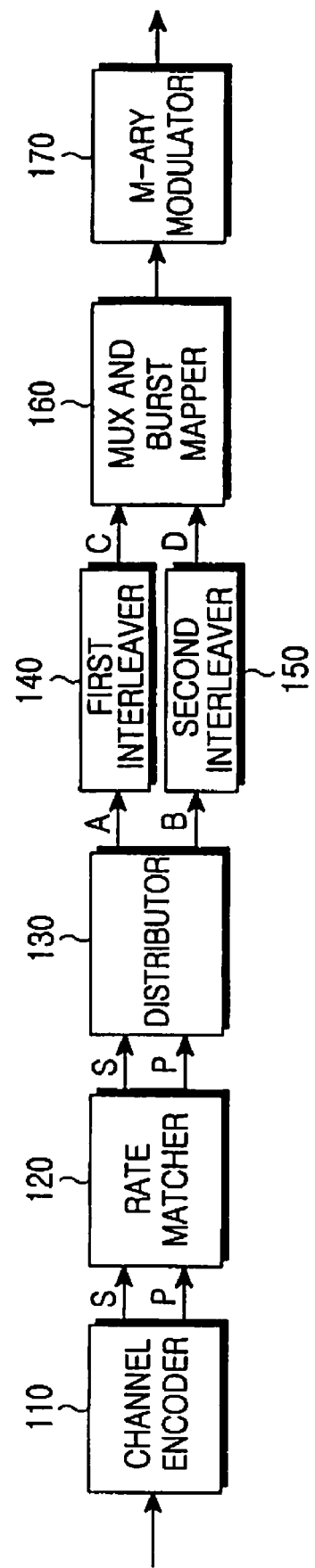
FIG. 1 is a block diagram illustrating a transmitter in a mobile communication system according to the present invention.

FIG. 1 is a block diagram illustrating a transmitter in a mobile communication system according to the present invention. Referring to FIG. 1, the transmitter includes a channel encoder 110, such as a convolution encoder or a turbo encoder. Coded bits from the channel encoder 110 are separated into S bits and P bits according to a used coding scheme. A rate matcher 120 matches the number of the S bits and the P bits to a data rate by bit puncturing or bit repetition. A distributor 130 divides the rate-matched S bits and P bits into two sub-blocks A and B, and provides the sub-blocks A and B to first and second interleavers 140 and 150, respectively. The first and second interleavers 140 and 150 independently interleave the two types of data bits A and B. These first and second interleavers 140 and 150 prevent burst errors by subjecting adjacent symbols or bits to irregular channel fading. A MUX and burst mapper 160 multiplexes and burst-maps two interleaved data blocks C and D received from the first and second interleavers 140 and 150. An M-ary modulator 170 maps the coded bits received from the MUX and burst mapper 160 to modulation symbols according to a high-order modulation scheme such as 8PSK, 16QAM, 16QAM, 32QAM, or 64QAM.

Figure 2:
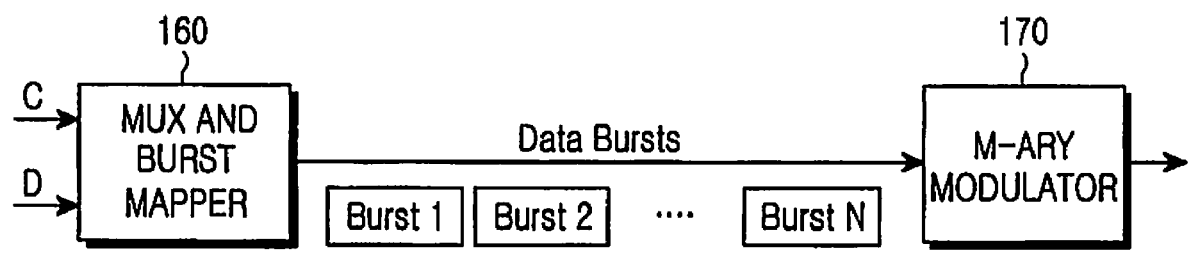
FIG. 2 illustrates an operation for generating a plurality of data bursts by multiplexing and burst mapping according to the present invention.

FIG. 2 illustrates an operation for generating a plurality of data bursts by multiplexing and burst mapping according to the present invention. Referring to FIG. 2, the MUX and burst mapper 160 allocates the two data blocks C and D to N bursts by multiplexing and burst mapping and provides the N bursts to the M-ary modulator 170.

Figure 3:
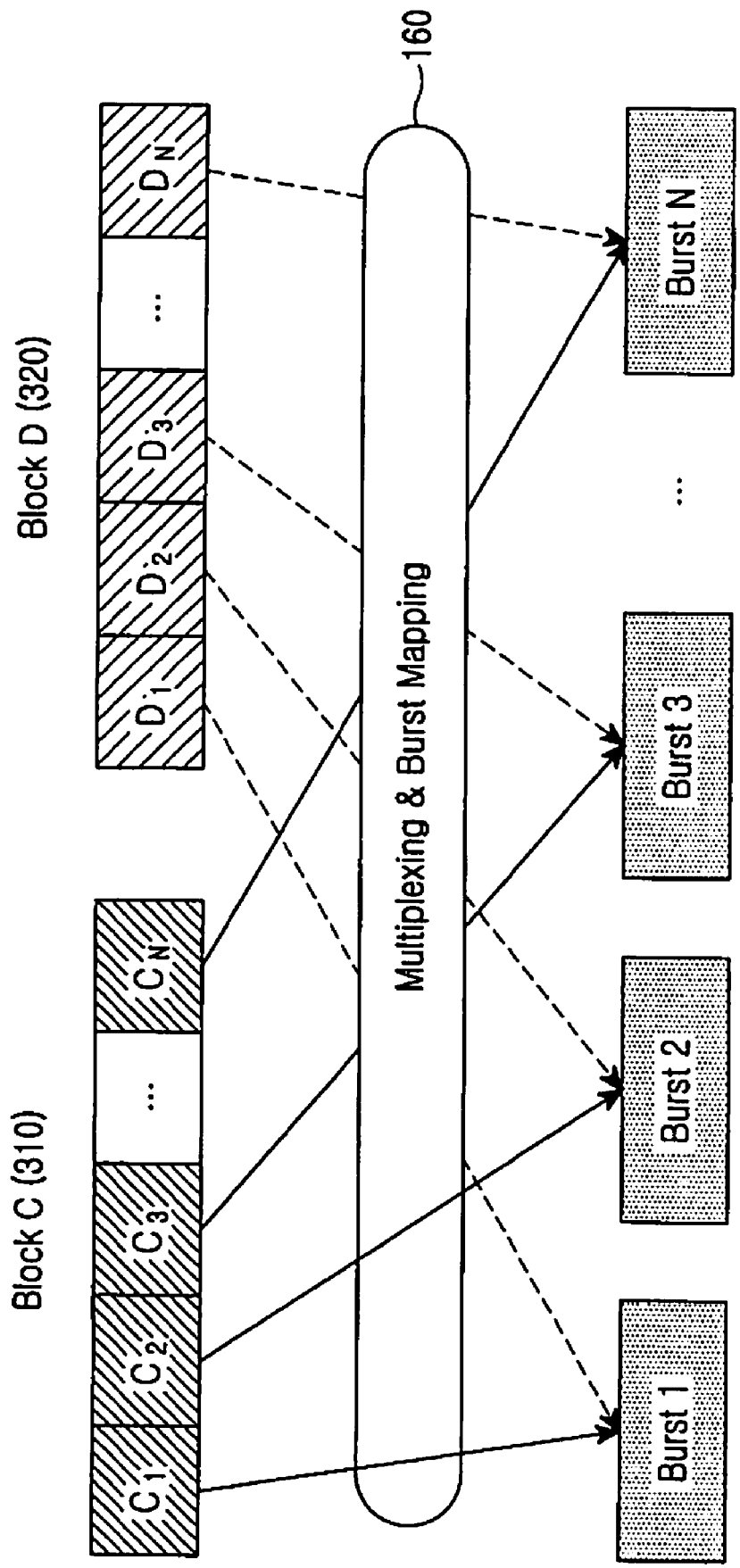
FIG. 3 illustrates an operation for multiplexing two data blocks to a plurality of data bursts in a Multiplexer (MUX) and burst mapper according to the present invention.

FIG. 3 illustrates an operation for multiplexing two data blocks to a plurality of data bursts in the MUX and burst mapper 160 according to the present invention. More specifically, in FIG. 3, the operation for multiplexing the two data blocks C and D to the N bursts in the MUX and burst mapper 160, illustrated in FIG. 2, is depicted in more detail.

Referring to FIG. 3, each of a block 310 (Block C) and a block 320 (Block D) is divided into N equal sub-blocks. Accordingly, the number of bits per sub-block is equal to the total number of bits in the block divided by N. For example, the bit number of $C_1$=the bit number of $C_2$= ... the bit number of $C_N$=(the total number of bits in C/N). One of the sub-blocks of Block C is paired with one of the sub-blocks of Block D and the pair is mapped to one burst.

In FIG. 3, sub-block $C_1$ and sub-block $D_1$ form a first burst (Burst 1) and sub-block $C_2$ and sub-block $D_2$ form a second burst (Burst 2). This multiplexing scheme can be useful for Time Division Multiple Access (TDMA) in which a Global System for Mobile communications (GSM) system operates. That is, for N=4, a GSM transmitter can transmit data by allocating each burst to one of eight time slots forming one TDMA frame. Because Block C and Block D include S bits and P bits, respectively, in the multiplexing scheme, symbol mapping like SMP can apply to burst mapping.

Figure 4:
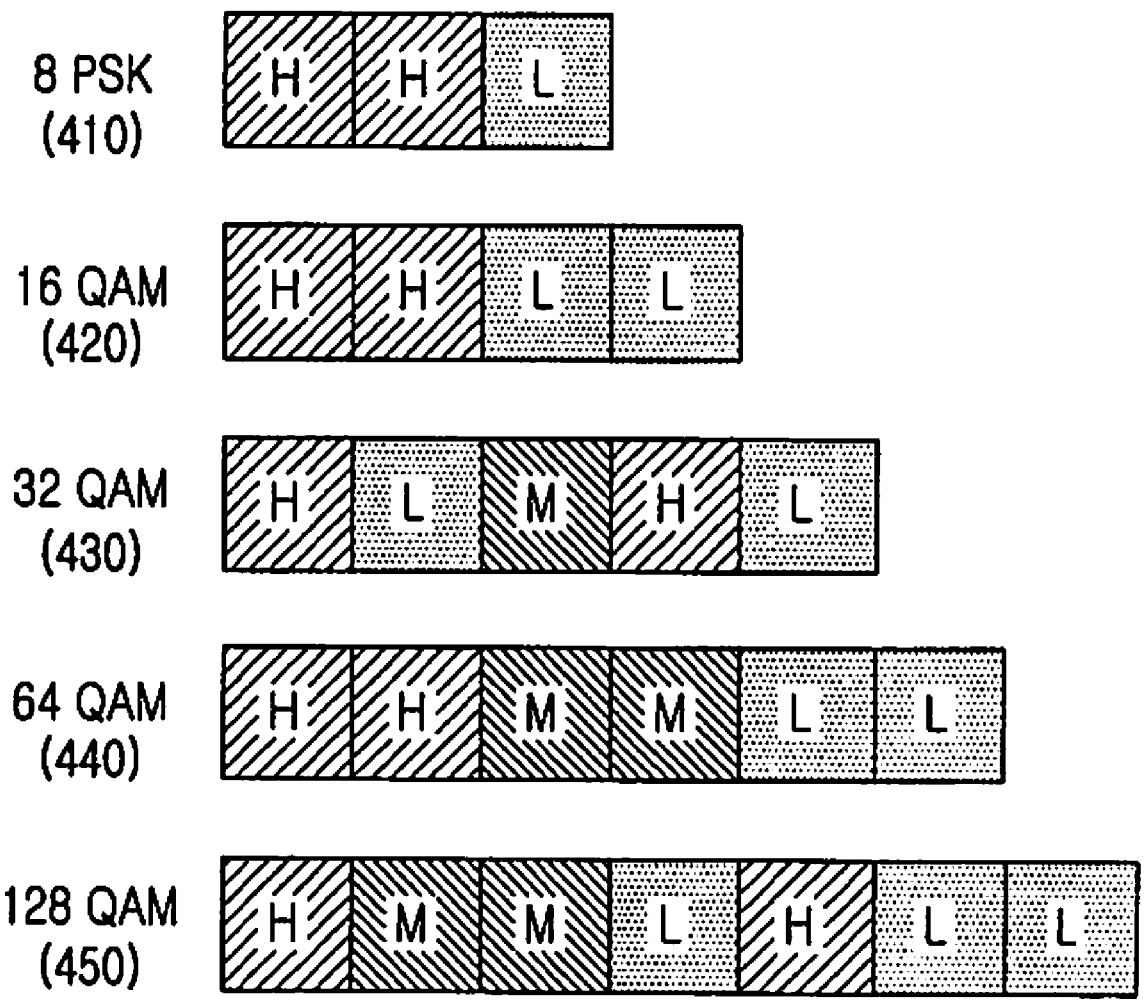
FIG. 4 illustrates bit reliability patterns of modulation symbols, to be applied to an M-ary modulator according to the present invention.

FIG. 4 illustrates bit reliability patterns of modulation symbols, to be applied to the M-ary modulator 170 according to the present invention. More specifically, referring to FIG. 4, a method for applying high-order modulation symbol mapping to bursts each including a sub-block of Block C and a sub-block of Block D in the M-ary modulator 170 will be described below.

Referring to FIG. 4, the bit positions of a high-order M-ary modulation symbol (M>7) are classified into a Higher reliable bit (H) position, a Medium reliable bit (M) position, and a Lower reliable bit (L) position according to their bit error probabilities. However, it is clear that other bit reliability patterns exist according to a gray symbol pattern used for the constellation of a modulation scheme and the layout of In-phase/Quadrature-phase (I/Q) bits for symbol transmission.

For example, when symbol mapping is based on SMP, a higher-priority bit (e.g. an S bit) is allocated to an H position and a lower-priority bit (e.g. a P bit) is allocated to an L position, for symbol transmission. A high-order modulation symbol of, for example, 32/64/128QAM, has an M position. That is, the bit error probability of the M position is between those of the H and L positions. Therefore, symbols can be mapped by designating the M position as the H position or the L position under circumstances.

For example, if a transmission data block includes more S bits than P bits, the M-ary modulator 170 designates the M position as the H position, for symbol mapping. On the contrary, if a transmission data block includes more P bits than S bits, the M-ary modulator 170 designates the M position as the L position, for symbol mapping.

Figure 5A:
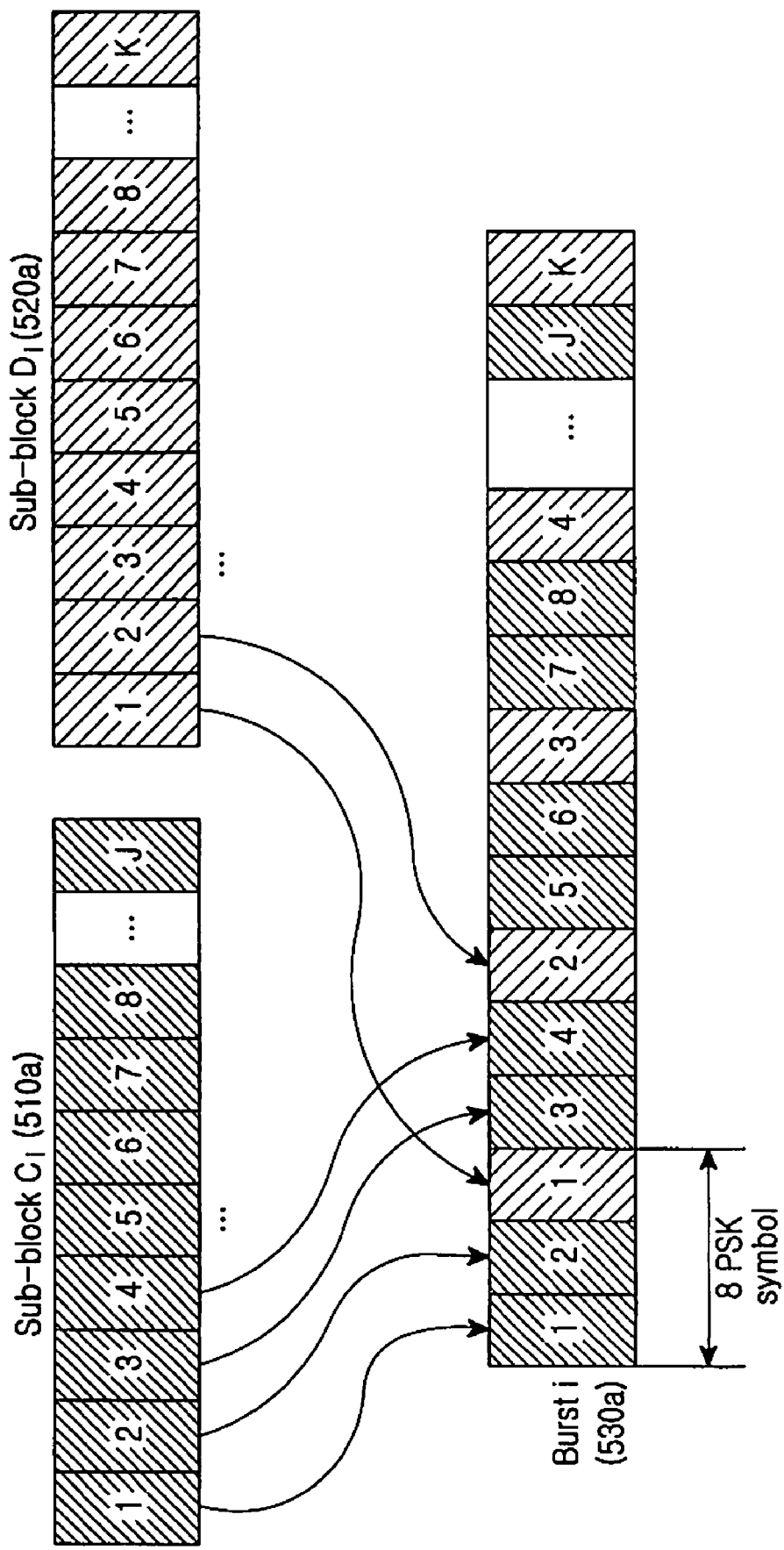
FIGS. 5A, 5B, and 5C illustrate symbol-based bit mapping methods in an M-ary modulator according to exemplary embodiments of the present invention.
Figure 5B:
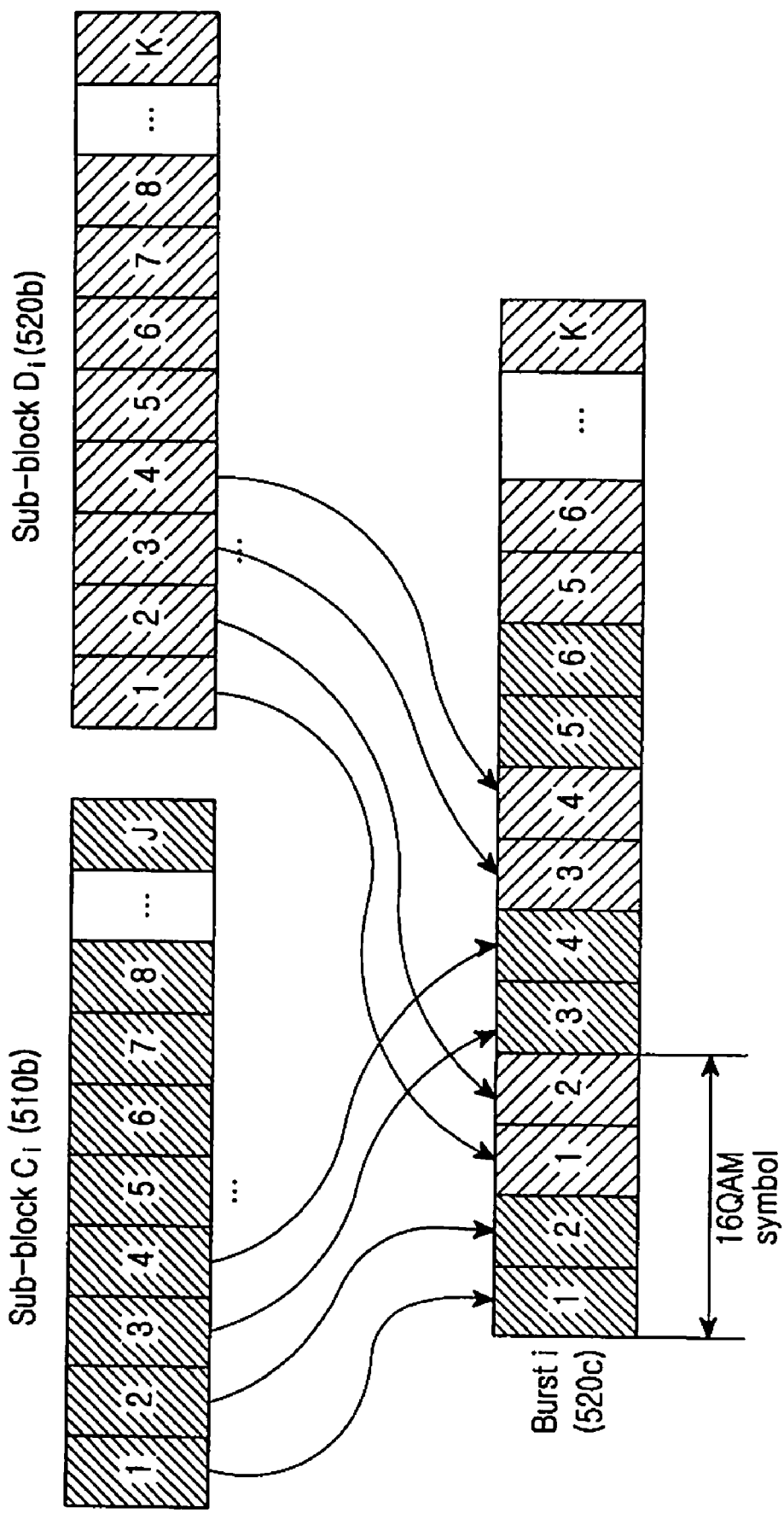
Figure 5C:
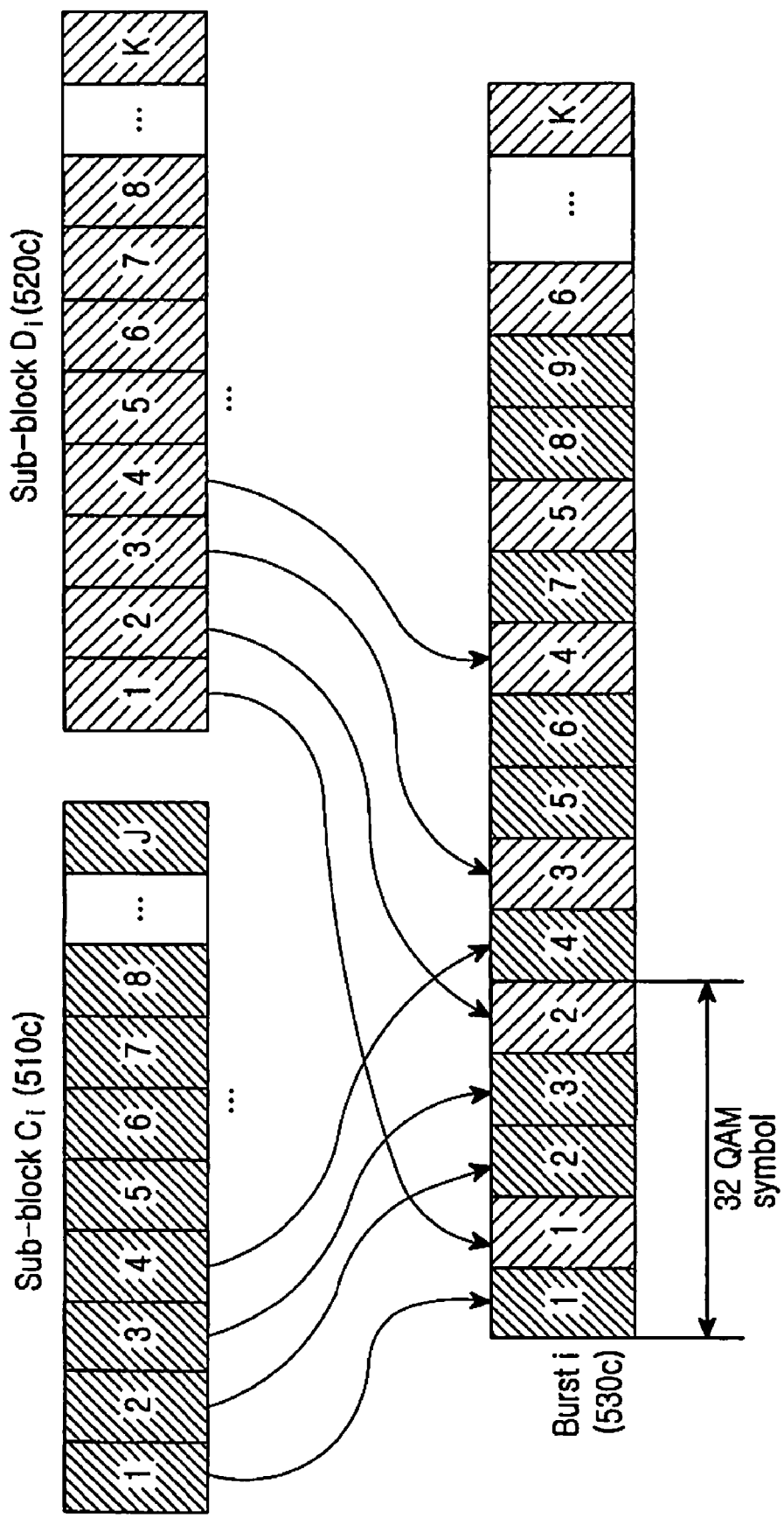

FIGS. 5A, 5B, and 5C illustrate symbol-based bit mapping methods in the M-ary modulator 170 according to exemplary embodiments of the present invention. More specifically, FIG. 5A illustrates a symbol-based bit mapping method for 8PSK, FIG. 5B illustrates a symbol-based bit mapping method for 16QAM, and FIG. 5C illustrates a symbol-based bit mapping method for 32QAM.

In FIGS. 5A, 5B, and 5C, bits are mapped to high-order modulation symbols on a symbol basis in an $i^{th}$ burst 530a, 530b, and 530c (Burst i) being a combination of two interleaved sub-blocks $C_i$ (510a, 510b, and 510c) and $D_i$ (520a, 520b, and 520c).

Referring to FIG. 5A, it is assumed that sub-block $C_i$ includes J bits and sub-block $D_i$ includes K bits. As illustrated in FIG. 4, the bit reliability pattern 410 of 8PSK is [H H L]. Hence, the M-ary modulator 170 sequentially maps two bits from sub-block $C_i$ and one bit from sub-block $D_i$ to one 8PSK symbol.

Referring to FIG. 5B, the M-ary modulator 170 can perform bit mapping on a symbol basis for 16QAM in the same manner. That is, as illustrated in FIG. 4, the bit reliability pattern 420 of 16QAM is [H H L L]. Hence, the M-ary modulator 170 sequentially maps two bits from sub-block $C_i$ and two bits from sub-block $D_i$ to one 16QAM symbol in Burst i.

Referring to FIG. 5C, compared to 8PSK illustrated in FIG. 5A and 16QAM illustrated in FIG. 5B, the bit reliability pattern 430 of 32QAM has an M position with a medium reliability. As illustrated in FIG. 5C, the M-ary modulator 170 performs bit mapping on a symbol basis by designating the M position as an H position. This symbol-based bit mapping can also be implemented by designating the M position as an L position in the M-ary modulator 170. It is clear that the M-ary modulator 170 can easily perform symbol-based bit mapping for the bit reliability pattern 440 of 64QAM and the bit reliability pattern 450 of 128QAM in the same manner.

Figure 6A:
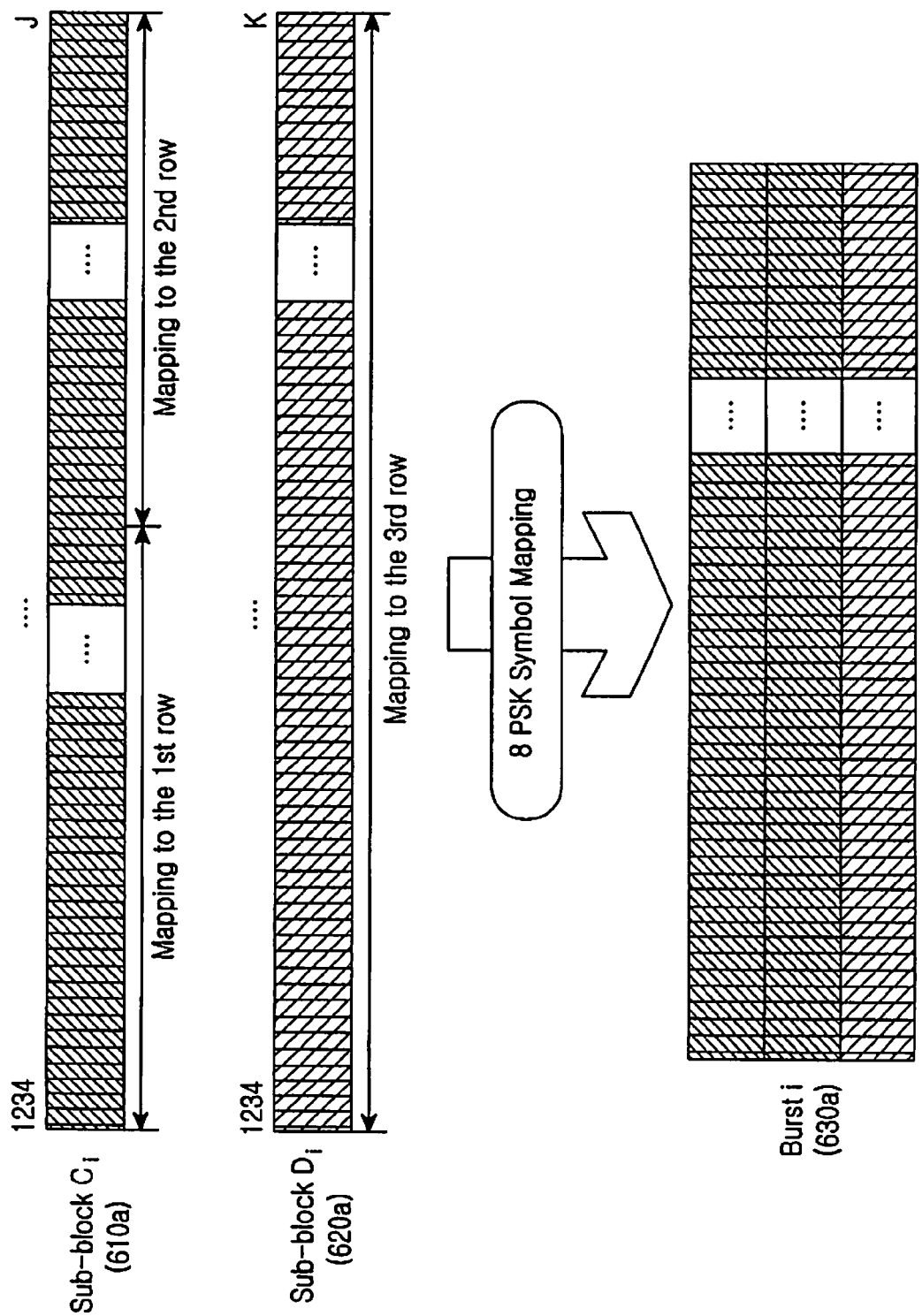
FIGS. 6A, 6B, and 6C illustrate block-based bit mapping methods in an M-ary modulator according to exemplary embodiments of the present invention.
Figure 6B:
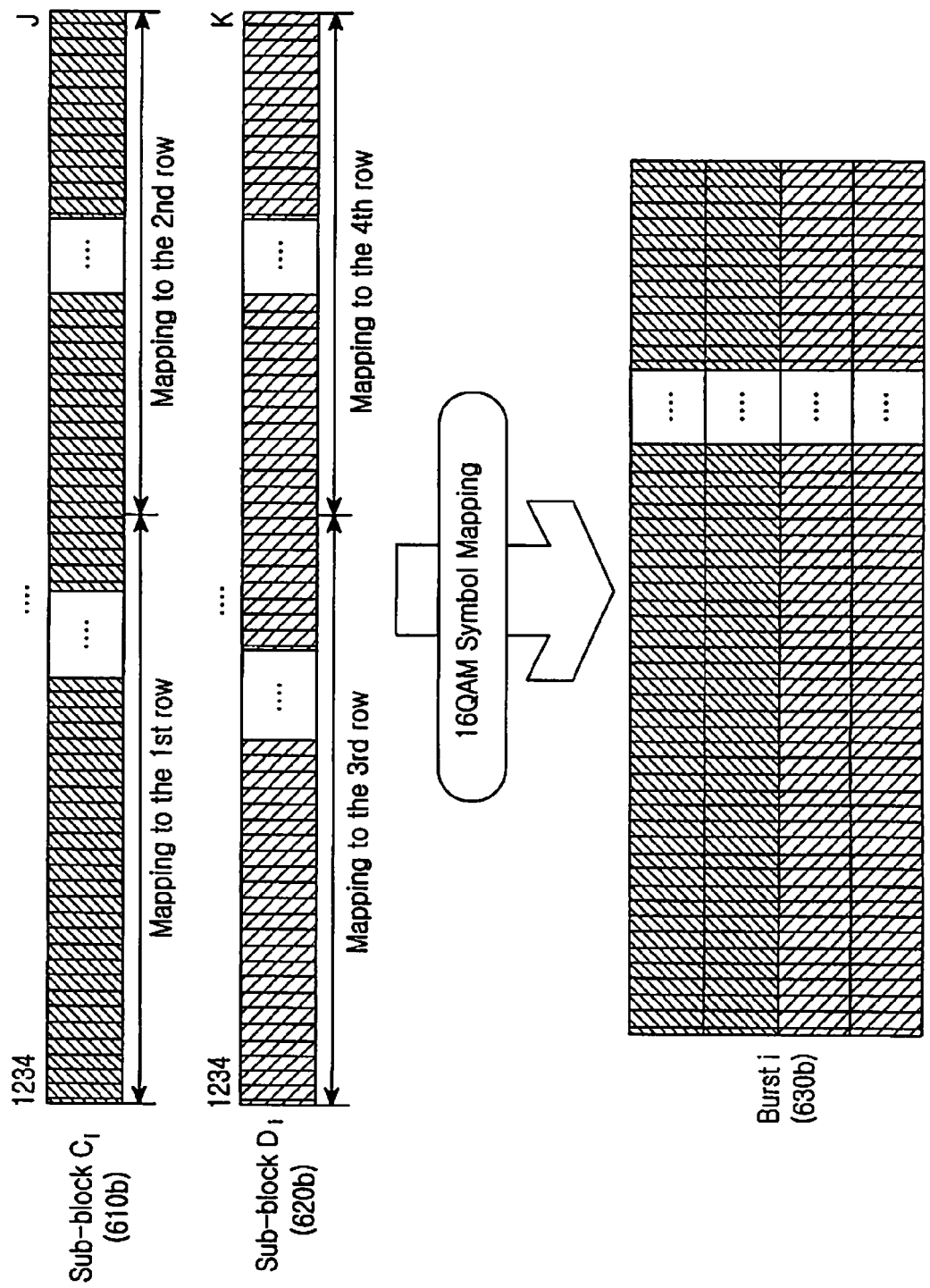
Figure 6C:
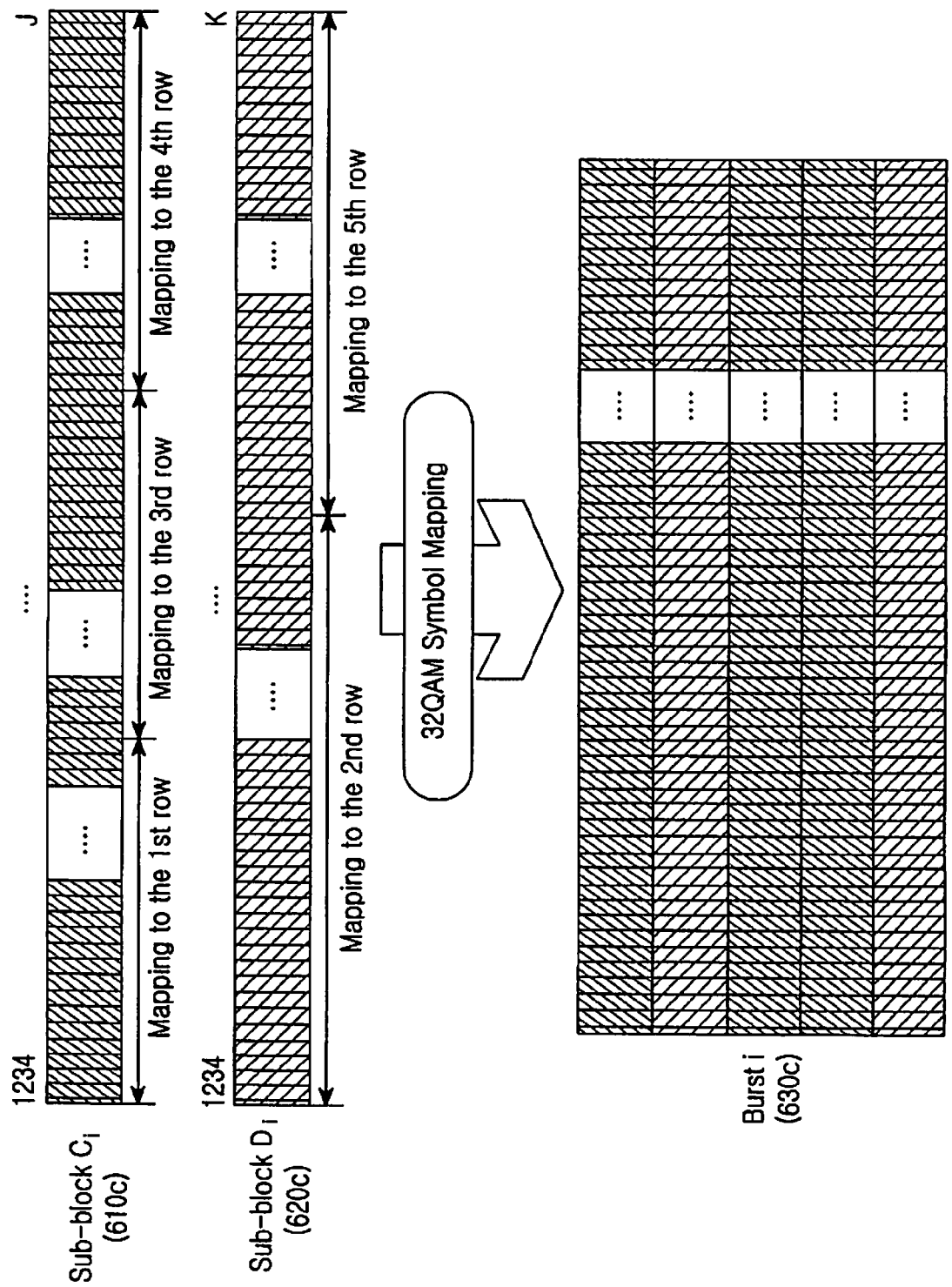

FIGS. 6A, 6B, and 6C illustrate block-based bit mapping methods in the M-ary modulator 170 according to exemplary embodiments of the present invention. More specifically, in the modified examples illustrated in FIGS. 6A, 6B, and 6C, bits are mapped to high-order modulation symbols on a block basis in an $i^{th}$ burst 630a, 630b, and 630c (Burst i) being a combination of two interleaved sub-blocks $C_i$ (610a, 610b, and 610c) and $D_i$ (620a, 620b, and 620c). That is, the M-ary modulator 170 constructs a burst in the form of a matrix and performs symbol mapping by filling bits by rows, starting from the first column on a block basis according to the bit reliability pattern of a modulation scheme. Each column of the matrix represents one symbol. Accordingly, symbols are read down by columns in the bursts illustrated in FIGS. 6A, 6B, and 6C.

FIG. 6A illustrates a block-based bit mapping for 8PSK. It is assumed herein that sub-block $C_i$ includes J bits and sub-block $D_i$ includes K bits. As illustrated in FIG. 4, the bit reliability pattern 410 of 8PSK is [H H L]. Therefore, the M-ary modulator 170 divides the bits of sub-block $C_i$ into two equal blocks and sequentially maps the two blocks to the first and second rows of a matrix. Also, the M-ary modulator 170 maps sub-block $D_i$ to the third row of the matrix without block division. In this manner, bits are mapped to 8PSK symbols.

FIG. 6B illustrates a block-based bit mapping for 16QAM and FIG. 6C illustrates a block-based bit mapping for 32QAM. As noted from FIGS. 6B and 6C, the M-ary modulator 170 performs bit mapping on a block basis according to a bit reliability pattern for 16QAM and 32QAM in the same manner as for 8PSK.

As described above, the bit reliability pattern of a modulation scheme may vary depending on a gray symbol pattern used for the constellation of the modulation scheme and the layout of I/Q channel bits for symbol transmission. It is well known that the reliability pattern of 16QAM, [H H L L] described with reference to FIGS. 5B and 6B can be changed to [H L H L] according to the bit layout of the constellation.

Figure 7A:
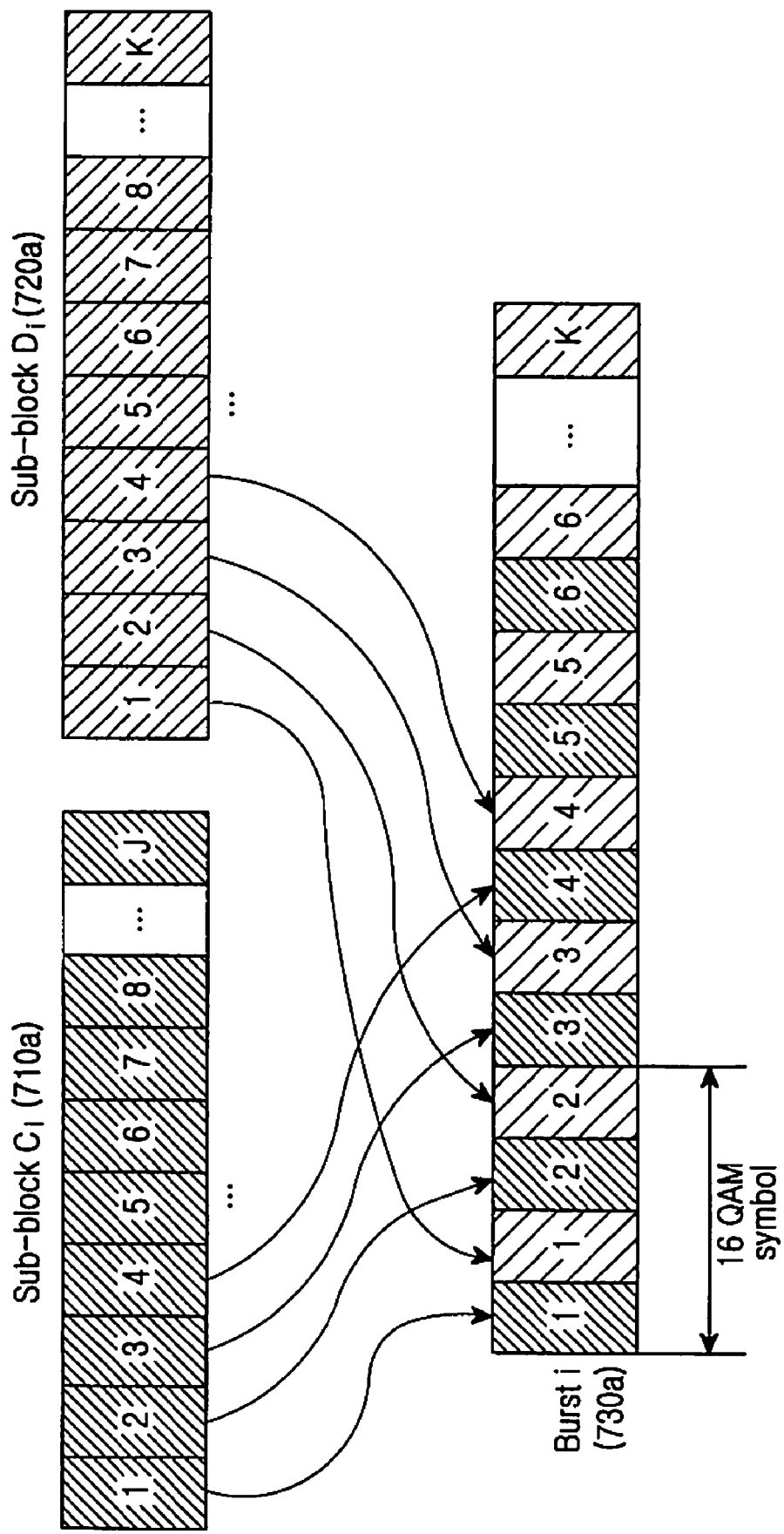
FIG. 7A illustrates a symbol-based bit mapping method for 16QAM in an M-ary modulator according to an exemplary embodiment of the present invention.
Figure 7B:
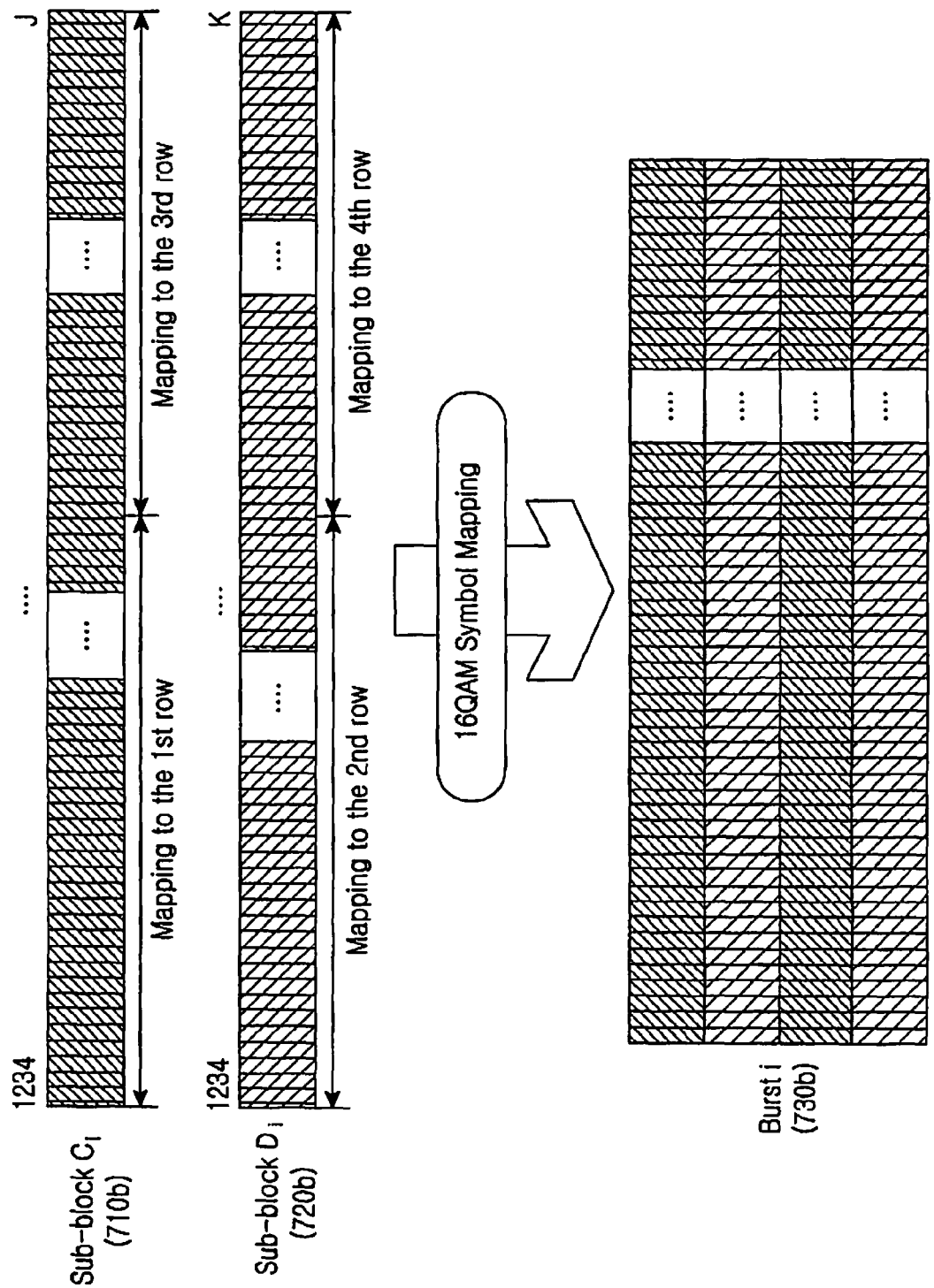
FIG. 7B illustrates a block-based bit mapping method for 16QAM in an M-ary modulator according to an exemplary embodiment of the present invention.

When the bit reliability pattern of 16QAM changes from [H H L L] to [H L H L], 16QAM bit mapping is performed as illustrated in FIGS. 7A and 7B.

FIG. 7A illustrates a symbol-based bit mapping method for 16QAM in the M-ary modulator 170 according to an exemplary embodiment of the present invention and FIG. 7B illustrates a block-based bit mapping method for 16QAM in the M-ary modulator 170 according to another exemplary embodiment of the present invention.

Referring to FIG. 7A, when the bit reliability pattern of 16QAM is changed to [H L H L], the M-ary modulator 170 alternately takes one bit from sub-block $C_i$ (710a) and one bit from sub-block $D_i$ (720a) in a sequential manner and maps them to Burst i (730a). Accordingly, bits are mapped to 16QAM symbols on a symbol basis.

Referring to FIG. 7B, when the bit reliability pattern of 16QAM is changed to [H L H L], the M-ary modulator 170 maps sub-block $C_i$ (710b) to the first and third rows of a matrix without block division and sub-block $D_i$ (720b) to the second and fourth rows of the matrix without block division and maps them to Burst i (730b). Accordingly, bits are mapped to 16QAM symbols on a block basis.

It is clearly to be understood that the bit mapping of 8PSK or 32QAM can be changed in the above-described manner according to its bit reliability pattern.

In accordance with the exemplary embodiments of the present invention for symbol-based bit mapping and block-based bit mapping described with reference to FIGS. 5A to 7B, burst mapping for 8PSK, 16QAM, and 32QAM in a Global System for Mobile communications/Enhanced Data Rates for Global Evolution (GSM/EDGE) will be described below in more detail.

<8PSK>

In 8PSK, the number of user data bits to be transmitted is 1248. The 1248 user data bits are distributed to four bursts and transmitted with header part data. When the bit reliability pattern of 8PSK is [H H L], sub-block C includes 832 bits and sub-block D includes 416 bits, expressed as follows.

C=C1, C2, C3, C4=c(k), k=0, 1, . . . , 831
D=D1, D2, D3, D4=d(k), k=0, 1, . . . , 415

The data bits of the two sub-blocks C and D are multiplexed to four bursts in GSM/EDGE. For the multiplexing, the symbol-based bit mapping and block-based bit mapping for 8PSK according to the present invention can be applied.

For symbol-based bit mapping for 8PSK, if bit-mapped data is denoted by DI, then DI can be expressed as shown in Equation (1).

$$DI = DI1, DI2, DI3, DI4 \quad (1)$$
$$= c(0)c(1)d(0), c(2)c(3)d(1), c(4)c(5)d(2), \ldots ,$$
$$c(830)c(831)d(415)$$
$$= di(k), k = 0, 1, \ldots , 1247$$

For block-based bit mapping for 8PSK, a matrix is formed with the data of blocks C and D on a block basis according to the reliability pattern [H H L]. That is, block C is divided and mapped to the first and second rows of the matrix because the first and second rows correspond to the H positions. Then block D is mapped to the third row of the matrix because the third row corresponds to the L position.

$$\begin{bmatrix} c(0) & c(1) & c(2) & \cdots & c(415) \\ c(416) & c(417) & c(418) & \cdots & c(831) \\ d(0) & d(1) & d(2) & \cdots & d(415) \end{bmatrix}$$

The bit-mapped data DI are sequentially read down from the matrix by columns, starting from c(0) to d(415). Thus, DI can be expressed as shown in Equation (2).

$$DI = DI1, DI2, DI3, DI4 \quad (2)$$
$$= c(0)c(416)d(0), c(1)c(417)d(1), c(2)c(418)d(2), \ldots ,$$
$$c(415)c(831)d(415)$$
$$= di(k), k = 0, 1, \ldots , 1247$$

After the multiplexing and bit mapping to the four bursts, the user data bits DI of Equation (1) and Equation (2) are allocated to the bursts as follows.

First burst: DI1=di(0) di(1) . . . di(311)
Second burst: DI2=di(312) di(313) . . . di(623)
Third burst: DI3=di(624) di(625) . . . di(935)
Fourth burst: DI4=di(936) di(937) . . . di(1247)

According to GSM/EDGE burst mapping, the mapping of the data DI may involve header part data (hi, u, q). That is,
For B=0, 1, 2, 3, let
e(B,j)=di(312B+j) for j=0, 1, . . . , 155
e(B,j)=hi(25B+j−156) for j=156, 157, . . . , 167
e(B,j)=u(9B+j−168) for j=168, 169, . . . , 173
e(B,j)=q(2B+j−174) for j=174, 175
e(B,j)=u(9B+j−170) for j=176, 177, 178
e(B,j)=hi(25B+j−167) for j=179, 180, . . . , 191
e(B,j)=di(312B+j−36) for j=192, 193, . . . , 347,
where B (B=0, 1, 2, 3) denotes the first to fourth bursts (B=0 to B=3). Thus, e(B, j) represents a $j^{th}$ bit of a $B^{th}$ burst.

<16QAM>

In 16QAM, the number of user data bits to be transmitted is 1664. The 1664 user data bits are distributed to four bursts and transmitted with header part data. The bit reliability pattern of 16QAM can be [H H L L] or [H L H L]. If [H H L L] is used, sub-block C includes 832 bits and sub-block D includes 832 bits, and is expressed as follows.

C=C1, C2, C3, C4=c(k), k=0, 1, . . . , 831
D=D1, D2, D3, D4=d(k), k=0, 1, . . . , 831

The data bits of the two sub-blocks C and D are multiplexed to four bursts in GSM/EDGE. For the multiplexing, the symbol-based bit mapping and block-based bit mapping for 16QAM according to the present invention can be applied.

For symbol-based bit mapping for 16QAM, if bit-mapped data is denoted by DI, then DI can be expressed as shown in Equation (3).

$$DI = DI1, DI2, DI3, DI4 \quad (3)$$
$$= c(0)c(1)d(0)d(1), c(2)c(3)d(2)d(3), c(4)c(5)d(4)d(5), \ldots ,$$
$$(830)c(831)d(830)d(831)$$
$$= di(k), k = 0, 1, \ldots , 1663$$

For block-based bit mapping for 16QAM, a matrix is formed with the data of blocks C and D on a block basis according to the reliability pattern [H H L L]. That is, block C is divided and mapped to the first and second rows of the matrix because the first and second rows correspond to the H positions. Then block D is divided and mapped to the third and fourth rows of the matrix since the third and fourth rows correspond to the L positions.

The bit-mapped data DI are sequentially read down from the matrix by columns, starting from c(0) to d(831). Thus, DI can be expressed as shown in Equation (4).

$$DI = c(0)c(416)d(0)d(416), c(1)c(417)d(1)d(417), \ldots , \quad (4)$$
$$c(415)c(831)d(415)d(831)$$
$$= di(k), k = 0, 1, \ldots , 1663$$

After multiplexing and bit mapping to the four bursts, the user data bits DI of Equation (3) and Equation (4) are allocated to the bursts as follows.

First burst: DI1=di(0) di(1) . . . di(415)
Second burst: DI2=di(416) di(417) . . . di(831)
Third burst: DI3=di(832) di(833) . . . di(1247)
Fourth burst: DI4=di(1248) di(1249) . . . di(1663)

According to GSM/EDGE burst mapping, the mapping of the data DI may involve header part data (hi, u, q). That is,
For B=0, 1, 2, 3, let
e(B,j)=di(416B+j) for j=0, 1, . . . , 207
e(B,j)=hi(34B+j−208) for j=208, 209, . . . , 229
e(B,j)=q(2B+j−230) for j=230, 231
e(B,j)=u(2B+j−232) for j=232, 233, . . . , 243
e(B,j)=hi(34B+j−222) for j=244, 245, . . . , 255 e(B,j)=di(416B+j−48) for j=256, 257, . . . , 463
where B (B=0, 1, 2, 3) denotes the first to fourth bursts (B=0 to B=3). Thus, e(B, j) represents a $j^{th}$ bit of a $B^{th}$ burst.

<32QAM>

In 32QAM, the number of user data bits to be transmitted is 2120. The 2120 user data bits are distributed to four bursts and transmitted with header part data. The bit reliability pattern of 32QAM can be [H L M H L]. For [H L M H L], sub-block C includes 1272 bits and sub-block D includes 848 bits. That is, M is dealt with as H and thus the data ratio between C:D is 3:2.

C=C1, C2, C3 , C4=c(k), k=0, 1, . . . , 1271
D=D1, D2, D3, D4=d(k), k=0, 1, . . . , 847

The data bits of the two sub-blocks C and D are multiplexed to four bursts in GSM/EDGE. For the multiplexing, the symbol-based bit mapping and block-based bit mapping for 32QAM according to the present invention can be applied.

For symbol-based bit mapping for 32QAM, if bit-mapped data is denoted by DI, then DI can be expressed as shown in Equation (5).

$$DI = DI1, DI2, DI3, DI4 \quad (5)$$
$$= c(0)d(0)c(1)c(2)d(1), c(3)d(2)c(4)c(5)d(3), \ldots ,$$
$$c(1269)d(846)c(1270)c(1271)d(847)$$
$$= di(k), k = 0, 1, \ldots , 2119$$

For block-based bit mapping for 32QAM, a matrix is formed with the data of blocks C and D on a block basis according to the reliability pattern [H L M H L]. That is, block C is divided into three parts and mapped to the first, third and fourth rows of the matrix because the first, third, and fourth rows correspond to H positions (or the M position). Thereafter, block D is divided and mapped to the second and fifth rows of the matrix because the second and fifth rows correspond to the L positions.

The bit-mapped data DI are sequentially read down from the matrix by columns, starting from c(0) to d(1271). Thus, DI can be expressed as shown in Equation (6).

$$DI = c(0)d(0)c(424)c(848)d(424), \quad (6)$$
$$c(1)d(1)c(425)c(849)d(425), \ldots ,$$
$$c(423)d(423)c(847)c(1271)d(847)$$
$$= di(k), k = 0, 1, \ldots , 2119$$

After the multiplexing and bit mapping to the four bursts, the user data bits DI of Equation (5) and Equation (6) are allocated to the bursts as follows.

First burst: DI1=di(0) di(1) . . . di(529)
Second burst: DI2=di(530) di(531) . . . di(1059)
Third burst: DI3=di(1060) di(1061) . . . di(1589)
Fourth burst: DI4=di(1590) di(1591) . . . di(2119)

According to GSM/EDGE burst mapping, the mapping of the data DI may involve header part data (hi, u, q). That is, For B=0, 1, 2, 3, let
e(B,j)=di(530B+j) for j=0, 1, . . . , 264
e(B,j)=hi(33B+j−265) for j=265, 266, . . . , 287
e(B,j)=q(2B+j−288) for j=288, 289
e(B,j)=u(15B+j−290) for j=290, 291, . . . , 304
e(B,j)=hi(33B+j−282) for j=305, 306, . . . , 314
e(B,j)=di(530B+j−50) for j=315, 316, . . . , 579, where B (B=0, 1, 2, 3) denotes the first to fourth bursts (B=0 to B=3). Thus, e(B, j) represents a $j^{th}$ bit of a $B^{th}$ burst.

While not described as an exemplary embodiment of the present invention, it is obvious to those skilled in the art that symbol-based bit mapping and block-based bit mapping can be easily performed for 64QAM and 128QAM in the above-described manner.

Figure 8:
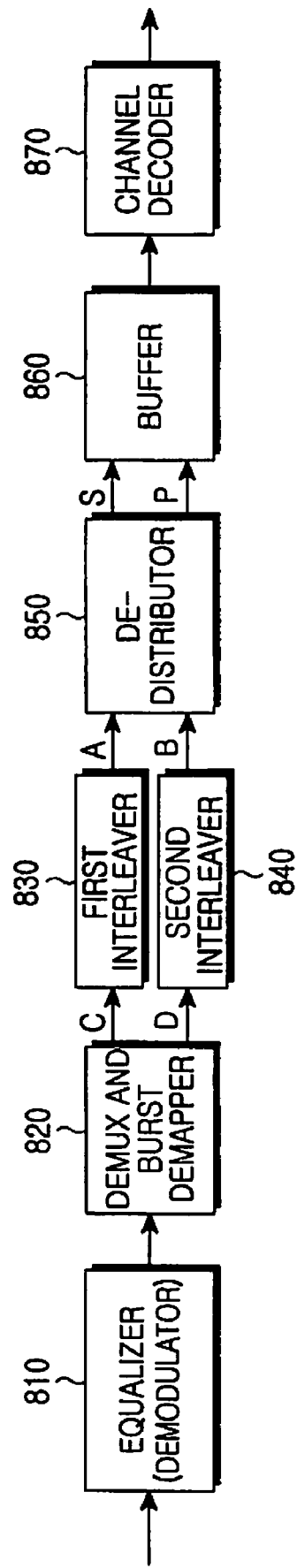
FIG. 8 is a block diagram illustrating a receiver in a mobile communication system according to the present invention.

FIG. 8 is a block diagram of a receiver in the mobile communication system according to the present invention. The receiver is the counterpart of the transmitter with the MUX and burst mapper 160 and the M-ary modulator 170, by way of example.

Referring to FIG. 8, an equalizer (or demodulator) 810 removes channel interference and noise from received data. A Demultiplexer (DEMUX) and demapper 820 divides N data bursts free of interference and noise received from the equalizer 810 into two data blocks C and D. First and second deinterleavers 830 and 840 deinterleave the data blocks C and D, thereby recovering the data of the data blocks C and D to their original bit positions. A de-distributor 850 separates the deinterleaved data A and B into original S bits and P bits and stores them in a buffer 860. A channel decoder 870 recovers the buffered data to a data block transmitted by the transmitter.

Figure 9:
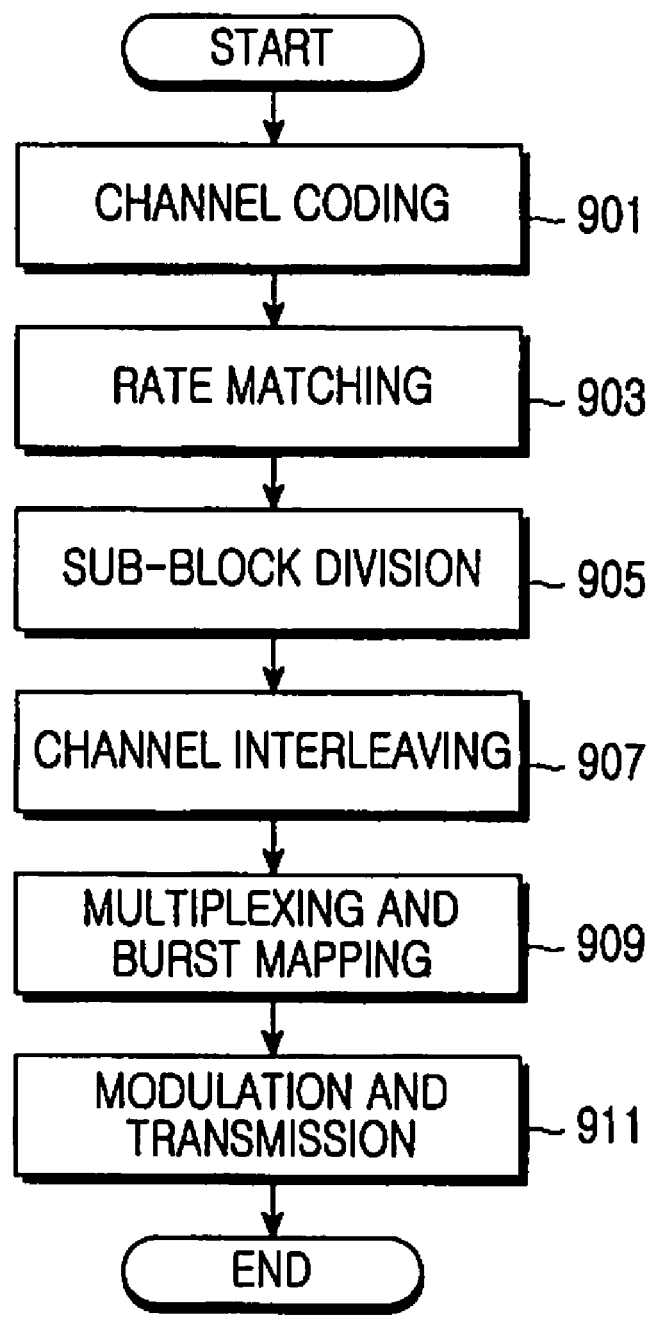
FIG. 9 is a flowchart illustrating a control operation of the transmitter in a mobile communication system according to the present invention.

FIG. 9 is a flowchart illustrating a control operation of the transmitter in the mobile communication system according to the present invention. Referring to FIGS. 1 and 9, the channel encoder 110 encodes transmission data in step 901. The rate matcher 120 rate-matches the coded data by puncturing or repetition and provides the rate-matched data separately as S bits and P bits to the distributor 130 in step 903. In step 905, the distributor 130 divides (or distributes) the S and P bits at a predetermined ratio and outputs the divided S and P bits to the channel interleavers 140 and 150, respectively. The channel interleavers 140 and 150 channel-interleave the S and P bits, respectively, in step 907. In step 909, the MUX and burst mapper 160 multiplexes two interleaved data blocks C and D received from the channel interleavers 140 and 150 to N bursts according to an exemplary embodiment of the present invention. The M-ary modulator 170 performs symbol mapping in the multiplexed bursts by symbol-based bit mapping or block-based bit mapping according to a high-order modulation scheme and transmits each burst on a radio channel in step 911.

Figure 10:
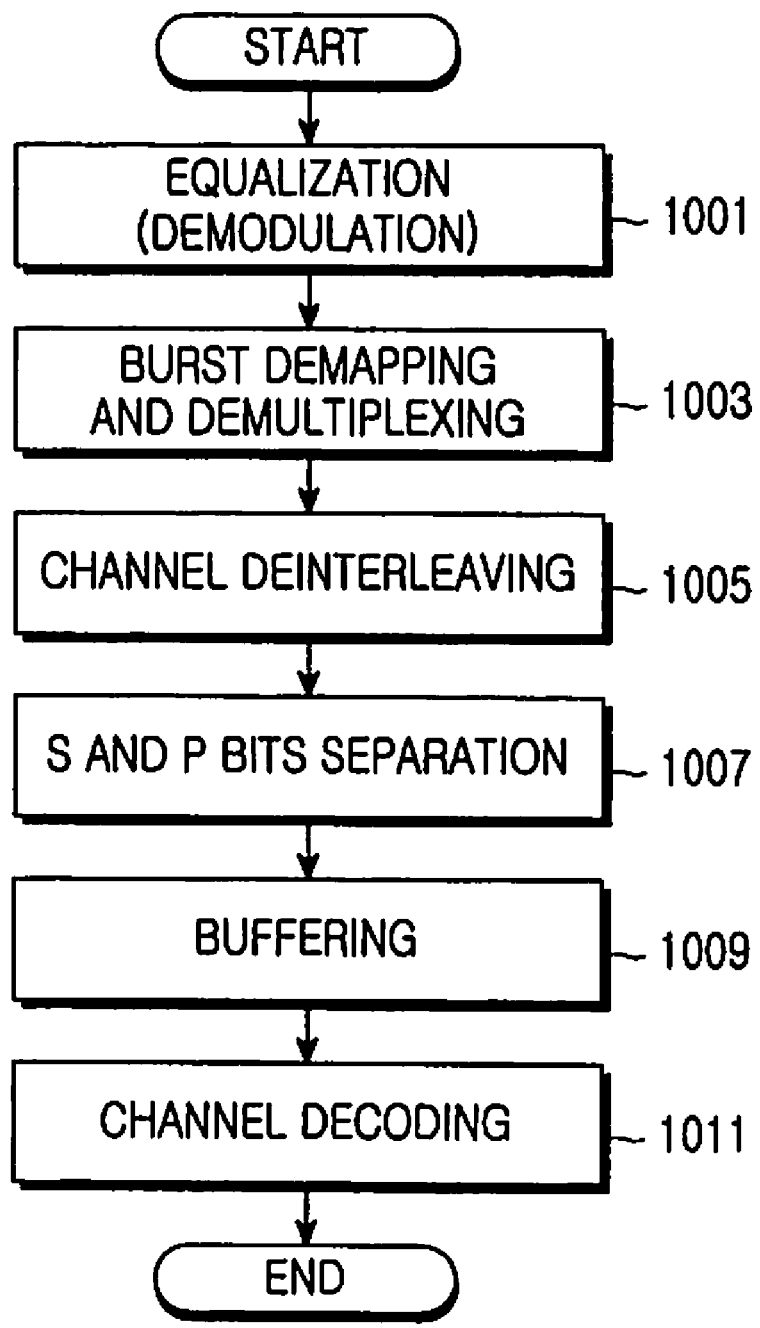
FIG. 10 is a flowchart illustrating a control operation of a receiver in a mobile communication system according to the present invention.

FIG. 10 is a flowchart illustrating a control operation of the receiver in the mobile communication system according to the present invention. In FIG. 10, the receiver operates in a reverse order of the operation of the transmitter illustrated in FIG. 9 in order to recover the transmitted data.

Referring to FIGS. 8 and 10, the equalizer 810 equalizes (or demodulates) data from a received signal in step 1001. During the data demodulation, the equalizer 810 removes channel interference and noise from the received data. In step 1003, the DEMUX and burst demapper 820 divides N data bursts free of channel interference and noise into two data blocks. The first and second deinterleavers 830 and 840 return the data of the two data blocks to their original bit positions in step 1005. The de-distributor 850 separates the deinterleaved data into original S and P bits in step 1007 and the buffer 860 buffers the S and P bits in step 1009. In step 1011, the channel decoder 870 recovers a data block transmitted by the transmitter from the buffered data.

As is apparent from the above description, the present invention advantageously provides a data transmission and reception apparatus and method in a mobile communication system, which are less sensitive to channel fading because sub-block division is determined based on the bit reliability pattern of a high-order modulation scheme. Thereafter, two sub-blocks interleaved by parallel interleavers are multiplexed to a plurality of bursts.

Also, the present invention improves system performance by providing a data transmission apparatus that maps bits to high-order modulation symbols on a symbol basis or on a block basis according to the bit reliability pattern of the high-order modulation symbols in multiplexed bursts, and by providing a data counterpart reception apparatus.

While the present invention has been shown and described with reference to certain exemplary embodiments of the present invention thereof, it will be understood by those skilled in the art that various changes in form and details may be made therein without departing from the spirit and scope of the present invention as defined by the appended claims and their equivalents.

What is claimed is:

1. An apparatus for transmitting symbols in a mobile communication system, comprising:
    a multiplexer and burst mapper for dividing each of first and second group data blocks into a plurality of sub-blocks, the symbols including the first group data block and the second group data block, the second group data block having a different priority level from the first group data block, and mapping a combination of one of the first group data sub-blocks and one of the second group data sub-blocks to each of plurality of bursts; and
    a modulator for mapping a bit of the first group data sub-block and a bit of the second group data sub-block to a symbol according to a bit reliability pattern of modulation symbols in each of the plurality of bursts,
    wherein the modulator performs symbol mapping by dividing bits of the first group data sub-block into at least one first block, dividing bits of the second group data sub-block into at least one second block, and mapping the at least one first block and the at least one second block to columns of a matrix according to the bit reliability pattern.

2. The apparatus of claim 1, wherein the modulator maps a higher-priority bit than a threshold to a higher-reliability bit position, if the bit reliability pattern has a higher-reliability bit position,
    maps a lower-priority bit than the threshold to a lower-reliability bit position, if the bit reliability pattern has the lower-reliability bit position, and
    maps the higher-priority bit to a medium-reliability bit position when more systematic bits than parity bits exist, and the lower-priority bit to the medium-reliability bit position when more of the parity bits than the systematic bits exist,
    wherein the higher-reliability bit position, the lower-reliability bit position and the medium-reliability bit position are determined according to bit error probabilities.

3. The apparatus of claim 1, wherein the first group data block is a systematic data block.

4. The apparatus of claim 1, wherein the second group data block is a parity data block.

5. A method for transmitting symbols in a mobile communication system, comprising:
    dividing each of first and second group data blocks into a plurality of sub-blocks, the symbols including the first group data block and the second group data block, the second group data block having a different priority level from the first group data block;
    mapping a combination of one of the first group data sub-blocks and one of the second group data sub-blocks to each of a plurality of bursts; and
    modulating data by mapping a bit of the first group data sub-block and a bit of the second group data sub-block to a symbol according to a bit reliability pattern of modulation symbols in each of the plurality of bursts,
    wherein modulating the data comprises:
    dividing bits of the first group data sub-block into at least one first block;
    dividing bits of the second group data sub-block into at least one second block; and
    mapping the at least one first block and the at least one second block to columns of a matrix according to the bit reliability pattern.

6. The method of claim 5, wherein modulating the data comprises:
    mapping a higher-priority bit than a threshold to a higher-reliability bit position, if the bit reliability pattern has the higher-reliability bit position;
    mapping a lower-priority bit than the threshold to a lower-reliability bit position, if the bit reliability pattern has the lower-reliability bit position; and
    mapping the higher-priority bit to a medium-reliability bit position, when more systematic bits than parity bits exist, and mapping the lower-priority bit to the medium-reliability bit position when more of the parity bits than the systematic bits exist,
    wherein the higher-reliability bit position, the lower-reliability bit position and the medium-reliability bit position are determined according to bit error probabilities.

7. The method of claim 5, wherein the first group data block includes a systematic data block.

8. The method of claim 5, wherein the second group data block includes a parity data block.

9. An apparatus for receiving symbols in a mobile communication system, comprising:
    an equalizer for receiving symbols and demodulating the symbols to a plurality of bursts, the symbols being produced by dividing each of a first group data block and a second group data block into a plurality of sub-blocks, the second group data block having a different priority level from the first group data block, mapping a combination of one of the first group data sub-blocks and one of the second group data sub-blocks to each of the plurality of bursts, and mapping a bit of the first group data sub-block and a bit of the second group data sub-block to a symbol according to a bit reliability pattern of modulation symbols in each of the plurality of bursts;
    a demultiplexer and burst demapper for dividing the plurality of bursts into two data blocks;
    first and second deinterleavers for deinterleaving the two data blocks, respectively;
    a de-distributor for separating the deinterleaved data into first group data and second group data;
    a buffer for buffering the first group data and the second group data; and
    a channel decoder for recovering the buffered first group data and second group data to the first and second group data blocks,
    wherein the symbol mapping is performed by dividing bits of the first group data sub-block into at least one first block, dividing bits of the second group data sub-block into at least one second block, and mapping the at least one first block and the at least one second block to columns of a matrix according to the bit reliability pattern.

10. A method for receiving symbols in a mobile communication system, comprising:
    receiving symbols;

demodulating the symbols to a plurality of bursts, the symbols being produced by dividing each of a first group data block and a second group data block into a plurality of sub-blocks, the second group data block having a different priority level than the first group data block, mapping a combination of one of the first group data sub-blocks and one of the second group data sub-blocks to each of the plurality of bursts, and mapping a bit of the first group data sub-block and a bit of the second group data sub-block to a symbol according to a bit reliability pattern of modulation symbols in each of the plurality of bursts;

dividing the plurality of bursts into two data blocks;

deinterleaving the two data blocks, respectively;

separating the deinterleaved data into first group data and second group data;

buffering the first group data and the second group data; and recovering the buffered first group data and second group data to the first and second group data blocks, wherein the symbol mapping is performed by dividing bits of the first group data sub-block into at least one first block, dividing bits of the second group data sub-block into at least one second block, and mapping the at least one first block and the at least one second block to columns of a matrix according to the bit reliability pattern.

* * * * *